(12) United States Patent
Yang et al.

(10) Patent No.: US 10,157,596 B2
(45) Date of Patent: Dec. 18, 2018

(54) IMAGE CONTROLLING APPARATUS AND DIGITAL PHOTO FRAME USING THE SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Xin Yang, Shenzhen (CN); Chieh-Yu Lee, New Taipei (TW)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/623,392

(22) Filed: Jun. 15, 2017

(65) Prior Publication Data
US 2018/0247615 A1 Aug. 30, 2018

(30) Foreign Application Priority Data
Feb. 28, 2017 (CN) .......................... 2017 1 0110437

(51) Int. Cl.
*G09G 5/38* (2006.01)
*G09G 5/00* (2006.01)
*H05K 5/00* (2006.01)
*H05K 5/02* (2006.01)

(52) U.S. Cl.
CPC ............... *G09G 5/38* (2013.01); *G09G 5/006* (2013.01); *H05K 5/0017* (2013.01); *G09G 2320/10* (2013.01); *G09G 2340/0492* (2013.01); *G09G 2380/16* (2013.01); *H05K 5/0217* (2013.01); *H05K 5/0247* (2013.01)

(58) Field of Classification Search
CPC ............ G09G 5/38; G09G 2340/0492; G09G 2380/16; H05K 5/0217; H05K 5/0247
See application file for complete search history.

(56) References Cited

U.S. PATENT DOCUMENTS

| | | | | |
|---|---|---|---|---|
| 6,567,101 B1* | 5/2003 | Thomas | ................ | G06F 1/1626 345/649 |
| 6,819,362 B2* | 11/2004 | Hsu | .................... | H04N 5/23293 345/659 |
| 8,217,964 B2* | 7/2012 | Laine | .................... | G06F 1/1626 345/659 |
| 2009/0207484 A1* | 8/2009 | Shia | .................... | H01S 3/06754 359/341.3 |
| 2009/0262493 A1* | 10/2009 | Lee | ....................... | G06F 1/1601 361/679.21 |

(Continued)

*Primary Examiner* — Ryan R Yang
(74) *Attorney, Agent, or Firm* — ScienBiziP, P.C.

(57) ABSTRACT

An image controlling apparatus in a digital photo frame includes a base defining an accommodating space, a pivot shaft, a conducting member on the pivot shaft and switching contact points in a circle with a radius of the conducting member. The pivot shaft and the conducting member are received in the accommodating space, and the conducting member can rotate under gravity, when two of the plurality of switching contact points are connected by the conducting member, the image controlling apparatus sends a predetermined controlling signal to control display orientation of an image. The digital photo frame is further disclosed.

20 Claims, 3 Drawing Sheets

(56) References Cited

U.S. PATENT DOCUMENTS

| | | | |
|---|---|---|---|
| 2014/0085341 A1* | 3/2014 | Shin | G09G 5/38 |
| | | | 345/659 |
| 2014/0362117 A1* | 12/2014 | Paulson | G09G 5/32 |
| | | | 345/659 |
| 2015/0116365 A1* | 4/2015 | Ding | G06F 3/0487 |
| | | | 345/659 |
| 2015/0339804 A1* | 11/2015 | Kim | G06F 3/04886 |
| | | | 345/659 |
| 2017/0263216 A1* | 9/2017 | Zhang | G06K 9/00087 |
| 2018/0053490 A1* | 2/2018 | Kimura | G06F 3/048 |

* cited by examiner

IMAGE CONTROLLING APPARATUS AND DIGITAL PHOTO FRAME USING THE SAME

FIELD

The subject matter herein generally relates to an image controlling apparatus and digital photo frames using the image controlling apparatus.

BACKGROUND

A digital photo frame includes devices such as a display panel and a card reader. Users only need to insert a memory card of the digital camera to the card reader of the digital photo frame to display digital pictures. Cost and inconvenience in developing the photos can be saved, therefore the digital photo frame is widely accepted.

When in use, a digital photo frame may be placed horizontally or vertically, thus an image controlling apparatus should be able to automatically rotate the image shown by the digital photo frame.

BRIEF DESCRIPTION OF THE DRAWINGS

Implementations of the present technology will now be described, by way of example only, with reference to the attached figures.

DETAILED DESCRIPTION

Figure 1:
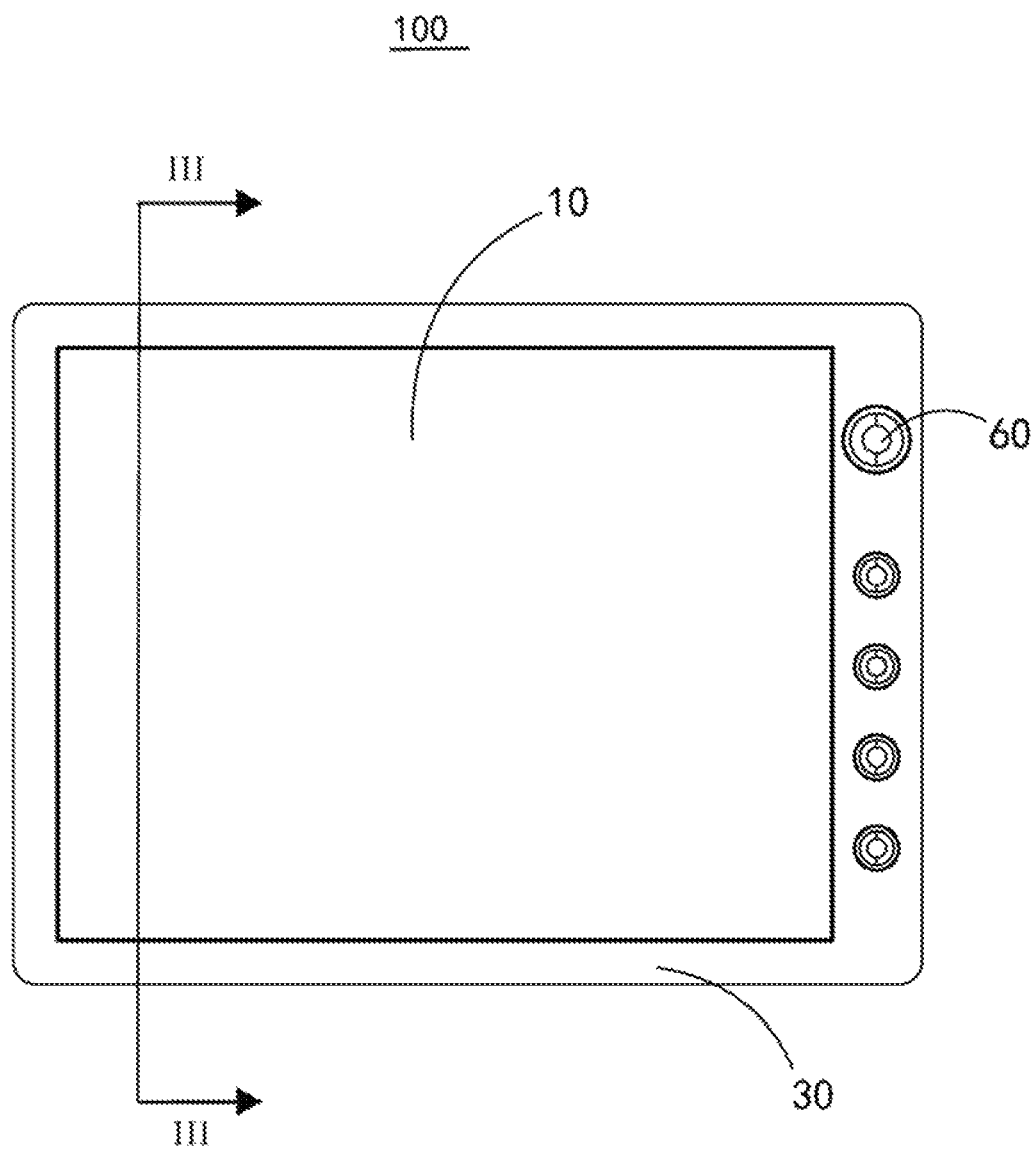
FIG. 1 is an isometric view of an exemplary embodiment of a digital photo frame.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
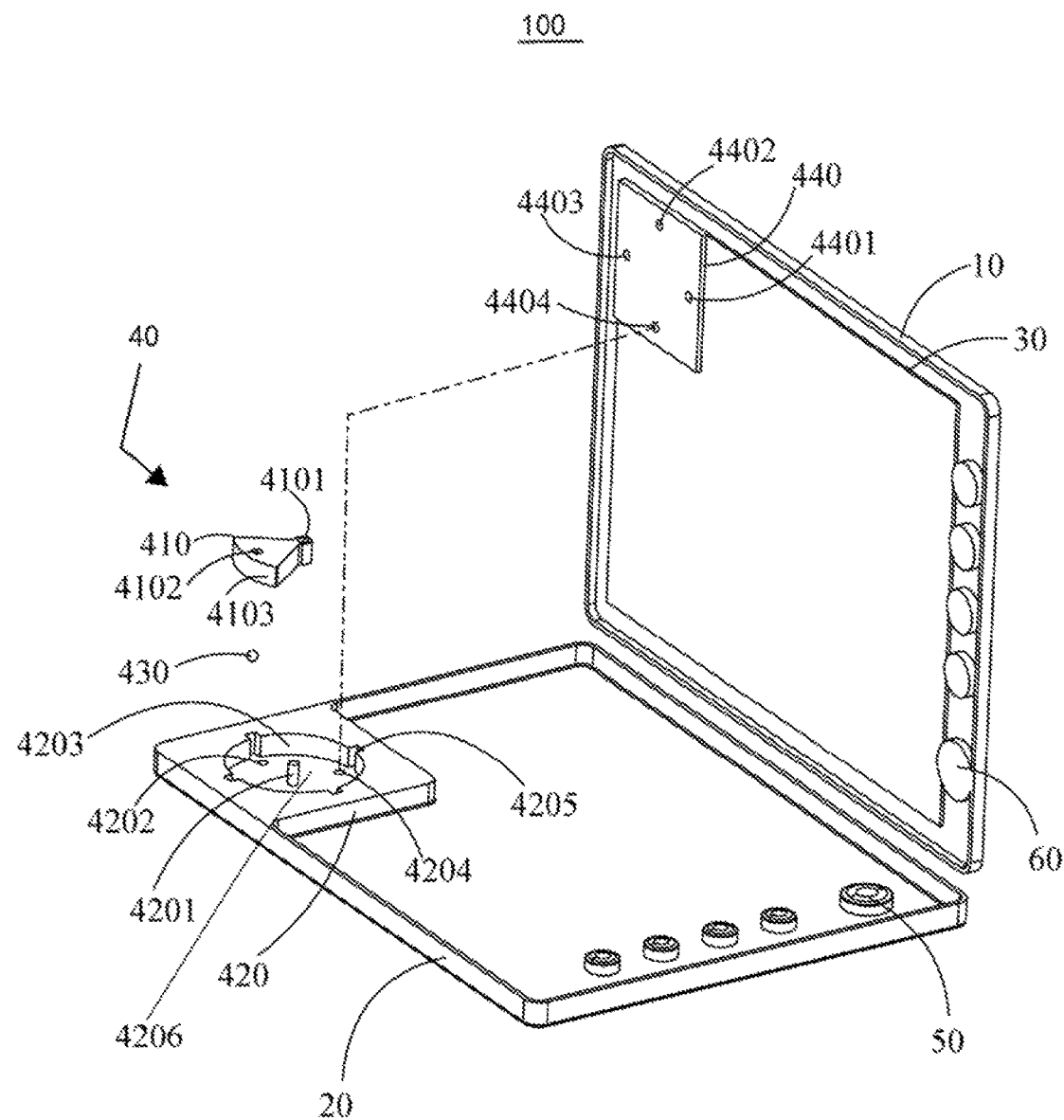
FIG. 2 is an exploded view of the digital photo frame of FIG. 1.
Figure 3:
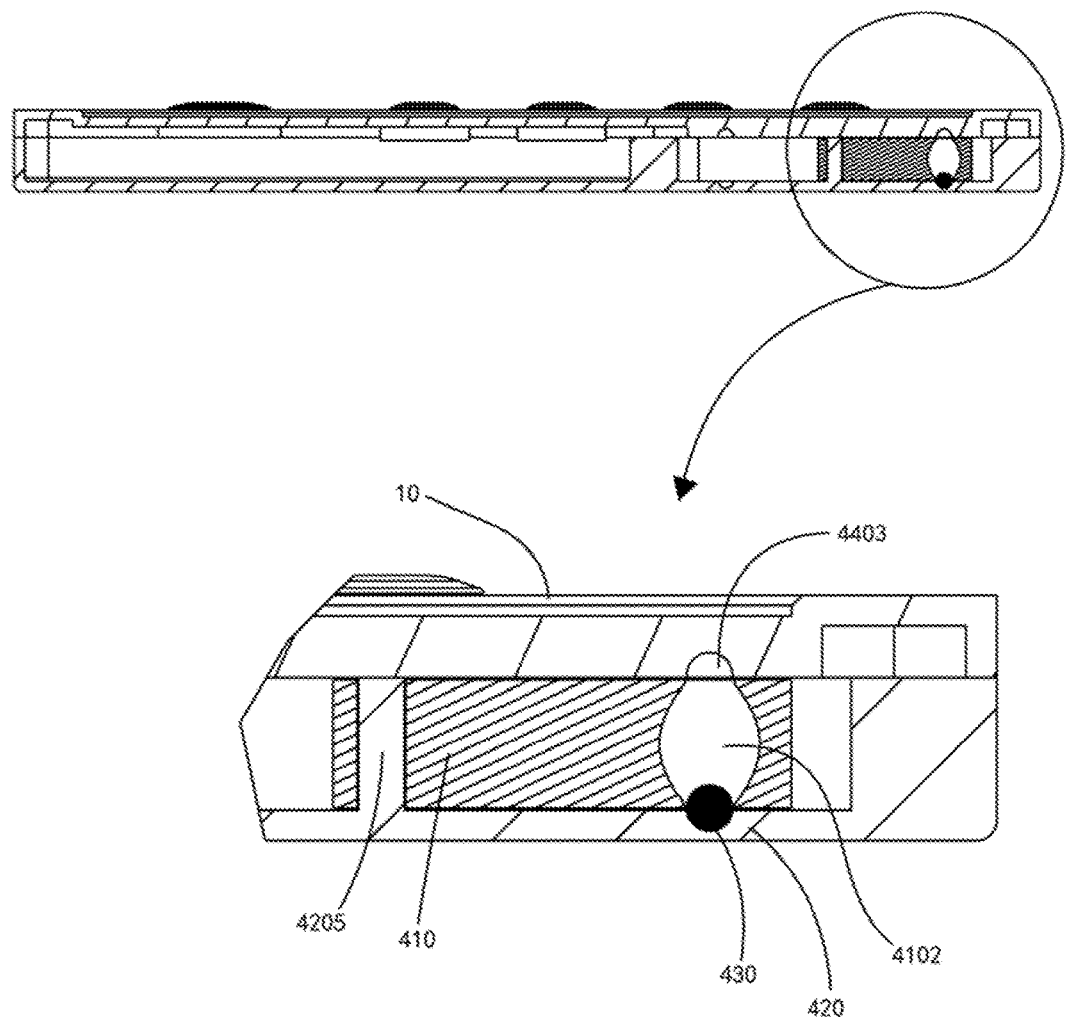
FIG. 3 is a sectional view of the digital photo frame of FIG. 1 seen from the direction indicated.

FIGS. 1 to 3 illustrate a digital photo frame 100 as an exemplary embodiment of the present disclosure.

The digital photo frame 100 can include a chassis 20, an upper cover 10 mounted on the chassis 20, a display member 30 mounted to the upper cover, a processing unit (not shown), and an image controlling apparatus 40. The digital photo frame 100 can further include buttons 50 and accommodation sections 60 for accommodating the buttons 50.

In the digital photo frame 100, the image controlling apparatus 40 is used to detect the standing orientation of the digital photo device 100, for example, standing horizontally or standing vertically. A predetermined signal is sent accordingly to the processing unit and the processing unit controls the display orientation of the display member 30.

Specifically, the image controlling apparatus 40 can include a base 420, a pivot shaft 4201, a conducting member 410, and a plurality of switching contact points 4203. An end of the conducting member 410 is rotatably connected to the pivot shaft 4201. The plurality of switching contact points 4203 is distributed on a circle with a radius equal to the length of the conducting member 4201. The base 420 defines an accommodating space 4206, and the pivot shaft 4201 and the conducting member 410 are received in the accommodating space 4206.

The base 420 and the chassis 20 can be molded in one piece to simplify the structure of the digital photo frame 100.

When a standing direction of the digital photo frame 100 is adjusted, the conducting member 410 rotates around the pivot shaft 4201 under gravity. When two of the plurality of switching contact points 4203 are connected by a free end of the conducting member 410, the image controlling apparatus 40 sends a predetermined controlling signal to the processing unit, and the processing unit controls display orientation of images shown by the display member 30.

Each of the plurality of switching contact points 4203 can be a conducting strip, the conducting strip can be circular arc shaped. The free end of the conducting member 410 can be circular arc shaped and can tangentially contact the conducting strip.

An intersection surface of the conducting member 410 is a segment of a circle. The conducting member 410 defines a pivot hole 4101 in the diametric point of the circle. The conducting member 410 is rotatably connected to the pivot shaft 4201 through the pivot hole 4101.

A central angle of the segment of the conducting member 410 is smaller than the central angle of the arc shaped conducting strip. For example, a central angle of the segment of the conducting member 410 can be 30 degrees, and a central angle of the arc shaped conducting strip is then larger than 30 degrees. If the free end of the conductor member 410 contacts only one arc shaped conducting strip, two adjacent arc shaped conducting strips will not be conductively connected, and then the display orientation of images shown by the display member 30 is not changed.

In at least one exemplary embodiment, the conducting member 410 can include an internal holding cavity (not shown), the holding cavity can be filled with heavy fluid or heavy particulate matter. The high fluidity of such fluid or matter enhances the sensitivity of the conducting member 410.

In at least one exemplary embodiment, the digital photo frame 100 includes four circular arc shaped conducting strips, the four conducting strips are uniformly distributed on the circle with a radius of the conducting member 410. Two adjacent conducting strips are separated by a gap 4205.

The four circular arc shaped conducting strips can be symmetrically arranged on a horizontal level and on a vertical level. For better understanding, the arc shaped conducting strip on lower-left of the base 420 is marked "A", the arc shaped conducting strip on lower-right of the base 420 is marked as "B", the arc shaped conducting strip on upper-right of the base 420 is marked as "C", and the arc shaped conducting strip on upper-left of the base 420 is marked as "D" (such markings are not shown in figures). When "A" and "B" are conductively connected by the conducting member 410, images of the display member 30 are shown in portrait form; when "B" and "C" are conductively connected by the conducting member 410, images shown by the display member 30 are rotated anticlockwise for 90 degrees; when "C" and "D" are conductively connected by the conducting member 410, images of the display member 30 are shown upside down. When "D" and "A" are conductively connected by the conducting member 410, images shown by the display member 30 are rotated clockwise for 90 degrees.

As illustrated in FIG. 3, in at least one exemplary embodiment, the image controlling apparatus 40 can further include a captive bearing ball 430. An upper surface of the conducting member 410 contacts with the upper cover 10, a bottom surface of the conducting member 410 contacts with the chassis 20. The conducting member 410 defines an ellipsoidal through hole 4102. The ellipsoidal through hole 4102 passes through the upper surface and the bottom surface of the conducting member 410. Each of the upper cover 10 and the chassis 20 defines a plurality of grooves corresponding to the ellipsoidal through hole 4102, and the grooves are distributed among the switching contact points to partially receive the bearing ball 430. For example, the upper cover 10 defines four first grooves (only 4202, 4204 are shown and marked due to limited viewing angle, the unmarked other two first grooves would be 4201 and 4203), and the upper cover 10 defines four second grooves 4401, 4402, 4403, and 4404 corresponding to the four first grooves—4202, 4204. The four first grooves 4202, 4204 and the four second grooves 4401, 4402, 4403, and 4404 are used to partially accommodate the bearing ball 430.

When the bearing ball 430 is all received in the ellipsoidal through hole 4102, the conducting member 430 is released and free to rotate. When the bearing ball 430 is partially received in one of the four first grooves 4202, 4204 or one of the four second grooves 4401, 4402, 4403, 4404, the conducting member 430 is lightly latched by the bearing ball 430.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. An image controlling apparatus comprising:
   a base defining an accommodating space;
   a pivot shaft;
   a conducting member rotatably connected to the pivot shaft; and
   a plurality of switching contact points distributing on a circle with a radius of the conducting member;
   wherein the pivot shaft and the conducting member are received in the accommodating space; when a standing direction of the image controlling apparatus is adjusted, the conducting member rotates around the pivot shaft under gravity; when two of the plurality of switching contact points are connected by a free end of the conducting member, the image controlling apparatus sends a predetermined controlling signal to control display orientation of a predetermined image.

2. The image controlling apparatus of claim 1, wherein each of the plurality of switching contact points is a conducting strip.

3. The image controlling apparatus of claim 2, wherein the conducting strip is circular arc shaped, the free end of the conducting member is circular arc shaped and tangentially contacts with the conducting strip.

4. The image controlling apparatus of claim 3, wherein a intersection surface of the conducting member is a sector.

5. The image controlling apparatus of claim 4, wherein the conducting strip defines a pivot hole in the central point of the sector.

6. The image controlling apparatus of claim 4, wherein a central angle of the sector is 30 degrees.

7. The image controlling apparatus of claim 3, wherein the image controlling apparatus comprises four circular arc shaped conducting strips, the four conducting strips are uniformly distributed on the circle with a radius of the conducting member.

8. The image controlling apparatus of claim 7, wherein two adjacent conducting strips are separated by a gap.

9. The image controlling apparatus of claim 1, wherein the conducting member comprises a holding cavity, the holding cavity is filled with mercury.

10. A digital photo frame comprising:
    a chassis;
    an upper cover mounted on the chassis;
    a display member mounted to the upper cover;
    a processing unit; and
    an image controlling apparatus comprising:
      a base defining an accommodating space;
      a pivot shaft;
      a conducting member rotatably connected to the pivot shaft; and
      a plurality of switching contact points distributing on a circle with a radius of the conducting member;
    wherein the pivot shaft and the conducting member are received in the accommodating space; when a standing direction of the digital photo frame is adjusted, the conducting member rotates around the pivot shaft under gravity, when two of the plurality of switching contact points are connected by a free end of the conducting member, the image controlling apparatus sends a predetermined controlling signal to the processing unit, the processing unit controls display orientation of images shown by the display member.

11. The digital photo frame of claim 10, wherein each of the plurality of switching contact points is a conducting strip, the conducting strip is circular arc shaped, the free end of the conducting member is circular arc shaped and tangentially contacts with the conducting strip.

12. The digital photo frame of claim 11, wherein a intersection surface of the conducting member is a sector.

13. The digital photo frame of claim 12, wherein the conducting strip defines a pivot hole in the central point of the sector.

14. The digital photo frame of claim 12, wherein a central angle of the sector is 30 degrees.

15. The digital photo frame of claim 11, wherein the digital photo frame comprises four circular arc shaped conducting strips, the four conducting strips are uniformly distributed on the circle with a radius of the conducting member.

16. The digital photo frame of claim 11, wherein two adjacent conducting strips are separated by a gap.

17. The digital photo frame of claim 10, wherein the conducting member comprises a holding cavity, the holding cavity is filled with mercury.

18. The digital photo frame of claim 15, wherein the four circular arc shaped conducting strips are symmetrically arranged on a horizontal display orientation and a vertical display orientation of the display member.

19. The digital photo frame of claim 10, wherein the base and the chassis are molded in one piece.

20. The digital photo frame of claim 10, wherein the image controlling apparatus further comprises a bearing ball; an upper surface of the conducting member contacts with the upper cover, a bottom surface of the conducting member contacts with the chassis; the conducting member defines an ellipsoidal through hole passing through the upper surface and the bottom surface; each of the upper cover and the chassis defines a plurality of grooves corresponding to the ellipsoidal through hole, the grooves are distributed among the switching contact points for partially receiving the bearing ball;

when the bearing ball is all received in the ellipsoidal through hole, the conducting member is released to rotate; when the bearing ball is partially received in one of the plurality of grooves, the conducting member is latched.

* * * * *